United States Patent [19]

Erratico

[11] Patent Number: 4,716,321
[45] Date of Patent: Dec. 29, 1987

[54] LOW NOISE, HIGH THERMAL STABILITY ATTENUATOR OF THE INTEGRATABLE TYPE

[75] Inventor: Pietro Erratico, Milan, Italy

[73] Assignee: SGS Microelettronica S.p.A., Catania, Italy

[21] Appl. No.: 827,921

[22] Filed: Feb. 10, 1986

[30] Foreign Application Priority Data

Feb. 20, 1985 [IT] Italy ................................ 19570 A/85

[51] Int. Cl.[4] ........................ H03K 5/08; H03K 17/62; H03H 7/24
[52] U.S. Cl. .................................... 307/540; 307/555; 307/264; 307/243; 333/81 R
[58] Field of Search ............... 307/243, 540, 555, 557, 307/558, 264; 333/81 R, 101

[56] References Cited

U.S. PATENT DOCUMENTS 3,562,659  2/1971  Kulas ................................ 333/81 R

FOREIGN PATENT DOCUMENTS 0080943  7/1978  Japan ................................ 333/81 R Primary Examiner—John Zazworsky
Attorney, Agent, or Firm—Guido Modiano; Albert Josif

[57] ABSTRACT

A low noise, high thermal stability attenuator of the integratable type is disclosed. The attenuator comprises a fixed network of resistive elements, having a plurality of outputs each at a different attenuation level, and a switched amplifier receiving at its input such different attenuation outputs, as well as a control signal which specifies which of the amplifier inputs is to be output. Advantageously, this attenuator may be implemented in several stages, each having different attenuation ranges or steps.

6 Claims, 3 Drawing Figures

LOW NOISE, HIGH THERMAL STABILITY ATTENUATOR OF THE INTEGRATABLE TYPE

BACKGROUND OF THE INVENTION

This invention relates to a low noise, high thermal stability attenuator of the integratable type, particualrly for attaining volume control over the audio signal through variable attenuators.

In order to attain volume control over the audio signal, two different techniques have been used heretofore. In particular, for TV applications, audio processor control devices are employed which operate on purely analog techniques, such as variable gain amplifiers. However, such devices exhibit problems relating to their temperature stability.

Another class of volume control devices comprise step-wise variable attenuators with attenuator elements connected in structures of the ladder type through switch systems which, in accordance with a control signal, provide electric connection and disconnection of such attenuator elements. Physically, such attenuators are formed by either switched resistors or switched capacitors in CMOS technology. In practice, such networks form bipolar digital-to-analog converters accepting at their inputs both positive and negative signals. In these devices, the digital word which controls the device is input connected, and the analog input is sent to the non-switched part of the network. These systems afford definitely good results and are highly advantageous in respect of their temperature stability and interfacing with audio processor systems. However, being implemented in the CMOS technique, they exhibit a high noise, especially at low frequencies, and require a fairly complicated process for the formation of CMOS-compatible resistive networks.

SUMMARY OF THE INVENTION

In view of the above situation, the aim underlying this invention is to provide an attenuator for volume controlling the audio signals such as to retain the advantages to be afforded by step-wise variable attenuator networks utilizing a weighed word and an analog signal at the input, overcoming their current disadvantages.

Within the above aim, it is a particular object of this invention to provide an attenuator of the discretely variable type which has a low noise with digital control of the attenuator itself.

Another object of this invention is to provide an attenuator which can be implemented with conventional manufacturing techniques at compatible manufacturing costs with commercially available attenuators.

A not least object of this invention is to provide an attenuator which is extremely reliable in operation, and in particular, has attenuation values which are stable over time and accurate.

The above aim, and these and other objects to become apparent hereinafter, are achieved by a low noise, high thermal stability attenuator of the integratable type, according to the invention, comprising a network of attenuator elements adapted to output preset attenuation levels, being variable in a discrete fashion, characterized in that said network of attenuator elements is fixed and has a plurality of outputs each having a different attenuation level, and in that it comprises a controlled switching element receiving at its input said plurality of network outputs, as well as a control signal, and electrically connecting that one of said inputs which is specified by said control signal with the output.

BRIEF DESCRIPTION OF THE DRAWINGS

Further features and advantages will be more clearly apparent from the following description of a preferred, but not exclusive, embodiment, as indicated by way of illustration and not exclusively in the accompanying drawings, where.

DESCRIPTION OF THE PREFERRED EMBODIMENTS

Figure 1:
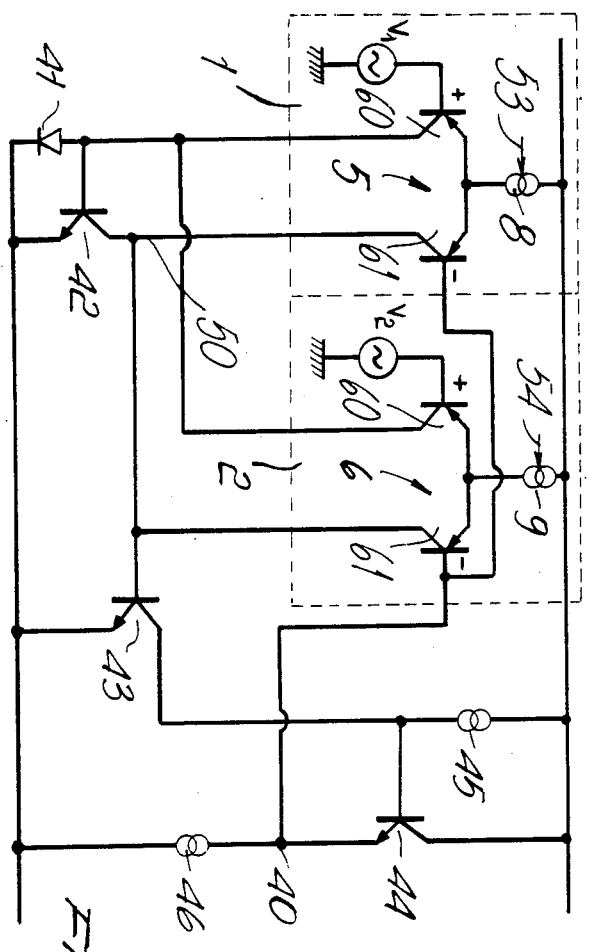
FIG. 1 shows a general wiring diagram of the attenuator according to the invention.

With reference to FIG. 1, the attenuator shown in the drawing is formed between two stages, an initial one generally indicated by the reference numeral 10, and a final one, generally indicated by the reference numeral 20 and being cascade connected to the former. Each stage 10, 20 is composed of an attenuation network formed of ladder arranged resistors 15, respectively 22, and a controlled switching element or analog multiplexer formed by a switched amplifier 30, respectively 34. As visible, each ladder-type attenuating network has an attenuating network input receiving a signal ($V_{IN}$ for stage 10) to be attenuated and a plurality of intermediate taps $16'$- $16^v$ or $24'$- $24^{iv}$ defining each an attenuating network output providing a different predetermined attenuation level output signal. At the points or intermediate taps $16'$ to $16^v$ and the points $24'$ to $24^{iv}$, there extend the lines $18'$ to $18^v$ and $26'$ to $26^{iv}$ connectable to the switched amplifier or analog mulitplexer 30 through a switch presented herein for clarity of illustration as the rotary switch 31 or 35. The switched amplifiers 30 and 34 further have an input 32, respectively 36, whereto a logic word is supplied which specifies which of the lines 18 or 26 is to be output, and accordingly, the position of the switch 31 or 35. In practice, as visible, the switched amplifiers 30, 34 are controlled switching elements having each a first signal input (formed by the switch 31 or 35) and a second control input 32 or 36 receiving each a control signal for operatively and selectively connecting the first signal input 31, 35 to one of the attenuating network outputs. The output of the switched amplifier 30, indicated at 33, is then connected to the first resistor 22 in the second stage such that the signal, as already attenuated through the first stage, undergoes a second attenuation through the stage 20, thereby the output voltage $V_{OUT}$ the controlled switching element output will be attenuated with respect to the input one by a factor equal to the product of attenuation through the first by that through the second stage. Expediently, the attenuation range or step between the outputs 16 and between the outputs 24 of the first or second stage is constant, whereas the first stage affords higher attenuation ranges than the second stage, e.g. for the first stage there would be attenuations of 10 dB between each output 16, whereas for the second stage there would be outputs at ranges of 2 dB.

Figure 3:
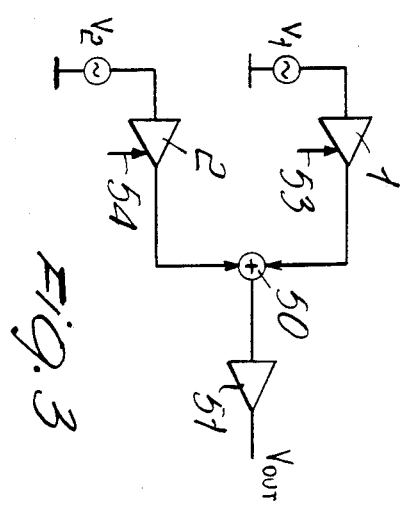
FIG. 3 is an equivalent block diagram of the circuit of FIG. 2.
Figure 2:
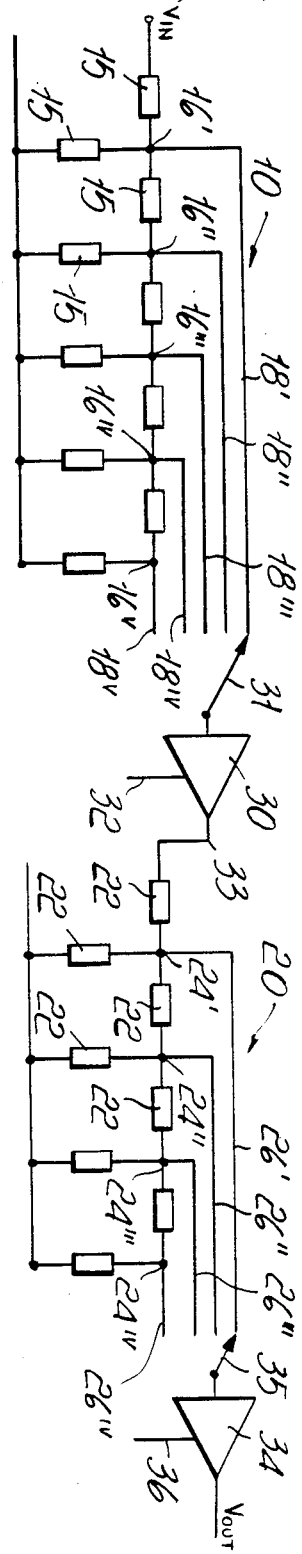
FIG. 2 shows a simplified equivalent diagram of the switching device incorporated to the invention, relating to the instance of two inputs.

An example of switched amplifier or analog mulitplexer, of the type presented in FIG. 1, is shown in the simplified wiring diagram of FIG. 2 and the equivalent diagram of FIG. 3. For the sake of simplicity, in these two Figures, a two-input amplifier has been shown; however, it is likewise possible to form an amplifier with any required number of inputs. In particular with reference to FIG. 2, that circuit has two amplifier input stages, indicated at 1 and 2. Each of these stages comprises substantially a differential amplifier 5 or 6 the positive input whereof is connected to the voltage source $V_1$ or $V_2$ corresponding to the output voltage on either line 18 or 26. On the other side, the inputs marked "-" are connected jointly to a common point indicated at 40 forming also the switched amplifier output. Each of the two differentials 5 and 6 is controlled by a respective source or switching biasing means 8 or 9 which is in turn switched on or off by an external signal, representing the control signal (supplied to the input 32 of FIG. 1). In detail, as deducible from FIG. 2, each differential amplifier 5, 6 includes an emitter-coupled transistor pair comprising first and second transistors 60, 61 having each emitter, base and collector terminals, the emitter terminals of the transistors 60, 61 of each transistor pair being coupled together and to a respective one of the switching biasing means 8, 9, the base terminal of the first transistor 60 of each transistor pair being connected to a respective one of the plurality of attenuating network outputs (represented here by the voltage sources $V_1$ and $V_2$, thereby all together the base terminals of the first transistors 60 defining the first signal input of the controlled switching element), the base terminal of the second transistor 61 of each transistor pair being connected to the common reference point 40, and the collector terminals of the transistors being connected to the output stage. In particular, the collector terminals of the second transistors 61 are connected together at a point 50 defining a summing knot (see FIG. 3). In turn, each switching biasing means 8, 9 has a switching input 53 or 54, the switching inputs of the biasing means defining all together the second control input (32 or 36) of the controlled switching element, receiving the control signal to operatively switching on only one of the biasing means and thereby only the respective one of the differential amplifier means. Of course, in the instance of the first attenuation stage according to FIG. 1, there will be provided five stages similar to 1 and 2, whereas for the stage 20 of FIG. 1, four such stages will be sufficient. Such input stages 1 and 2 are both connected with the remainder of the circuit including the diode 41 and the bias transistor 42, as well as the other elements of the output stage indicated at 51 in FIG. 3 including the transistor 43, transistor 44, and the sources 45 and 46. That solution appears to be a convenient one in that, in the instance of several inputs to the ampifier 30 or 34, it will be sufficient to provide more stages 1 and 2 while having the remainder of the circuit shared. In practice the circuit of FIG. 2 is the equivalent of that shown in FIG. 3, where the stages 1 and 2 may be seen, input signals $V_1$ and $V_2$, and control inputs 53 and 54 acting on the sources 8 and 9 of FIG. 2. The amplifiers 1 and 2 merge in a sum knot 50, that scheme being completed by the output amplifier 51 defining an amplifying output stage having an output stage input connected to the summing knot 50 and an output stage output at voltage $V_{OUT}$ defining the controlled switching element output. The switched amplifier operates as follows: the control signal supplied to the inputs 53 and 54 causes the current sources 8 and 9 to be switched on or off which, in turn, switch on or off the differentials 5 and 6 and enable or not the signal $V_1$ or $V_2$ to be present at the input. Of course, one only of the two signals $V_1$ or $V_2$ will be present at the output, thereby at the sum knot 50 there will appear one input signal only, which is then amplified and fed to output.

In practice, with the attenuator according to the invention, an attenuator has been provided, of the stepwise variable type, wherein the attenuating network is, however, fixed and has no switch elements therein, a sought attenuation being selected through an external element of the network which, according to a control signal, provides for connecting the network point where the sought attenuation occurs to the output. That solution makes it unnecessary to use CMOS technology switches and avoids the related problems of high noise within the attenuation network. By contrast, with the solution shown, it is possible to utilize bipolar technology to obtain a very accurate low noise attenuation system, since its output noise, besides that due to the attenuation network, is merely that of a low noise amplifier (which with current technology is in the order of 10 nV/$\sqrt{Hz}$ in the involved band). Consequently, it becomes possible to obtain a much improved signal/noise ratio over the prior art devices.

An advantage afforded by the solution presented resides in that it is possible to implement the gain control in several stages, each with different attenuation ranges or steps. This makes interfacing of the device simpler and affords at the same time a high overall range of control over the audio signal.

With the attenuator according to the invention it is further possible to achieve a higher accuracy that with prior devices. In fact, with prior attenuators having an attenuation network formed of resistive elements each connected to a respective switch integrated to the network itself, the switch resistance may be more than negligible and affect the attenuation, different for each of the attenuator branches. On the contrary, with the solution presented, having fixed non-switched resistors, there occurs no additional resistance other than that of the attenuation elements, the one error that may occur being the offset one due to the switched amplifier. That error, however, additionally to being very low, can only introduce an offset in DC.

That offset may then be filtered off in a known manner, thereby the system and its assembly have a much higher accuracy than known systems.

Furthermore, the attenuator of this invention may be implemented in accordance with known technologies and be readily integrated.

The invention herein is susceptible to many modifications and changes, all falling within the scope of the inventive concept. In particular, it should be noted that, while a particular embodiment has been shown for the switched amplifier, the invention is not limited thereto, and specifically, for the switched switch any known element may be utilized which operates as an analog multiplexer capable of switching to output a selective one of n inputs, according to the digital control signal.

Furthermore, all of the technical details may be replaced with technical equivalents thereof.

I claim:

1. A low noise, high thermal stability attenuator of the integratable type, comprising:
   a ladder-type attenuating network having an attenuating network input receiving a signal to be attenuated and a plurality of intermediate taps defining each an attenuating network output providing a different predetermined attenuation level output signal and a controlled switching element including a plurality of amplifying means, a correspondent plurality of biasing means and an amplifying output stage.

each said amplifying means having at least one first attenuated signal input, one second bias input and an amplifying means output, each said first attenuated signal input of said amplifying means being connected to a respective one of said attenuating network outputs, each said second bias input of said amplifying means being connected to a respective one of said biasing means and said amplifying means outputs of said amplifying means being connected together and defining a summing knot, each said biasing means having a switching input, said switching inputs of said biasing means receiving a control signal to operatively switch on only one of said biasing means and thereby only a respective one of said amplifying means of said plurality, said amplifying output stage having an output stage input connected to said summing knot and an output stage output defining an attenuator output.

2. An attenuator according to claim 1, wherein said controlled switching element is implemented in bipolar technology.

3. An attenuator according to claim 1, wherein said ladder-type attenuating network comprises a plurality of resistive elements in ladder configuration.

4. An attenuator according to claim 1, comprising at least one further ladder-type attenuating network having a further attenuating network input connected to said attenuator output and a further plurality of controlled attenuating network outputs connected to at least one further controlled switching element, said different predetermined attenuation level output signals of said ladder-type attenuating network having attenuation levels varying with a first constant step, and said further plurality of attenuating network outputs of said further ladder-type attenuating network providing further output signals having further attenuation levels varying with a further constant step, different from said first constant step.

5. A low noise, high thermal stability attenuator of the integratable type, comprising:

a ladder-type attenuating network having an attenuating network input receiving a signal to be attenuated and a plurality of intermediate taps defining each an attenuating network output providing a different predetermined attenuation level output signal, and a controlled switching element including a plurality of differential amplifier means, a correspondent plurality of biasing means and an amplifying output stage, each said differential amplifier means having one first attenuated signal input, a second bias signal input, a third reference signal input, and a differential amplifier output, each said first attenuated signal input of said differential amplifier means being connected to a respective one of said attenuating network outputs, said third reference signal inputs of said differential amplifier means being connected together and to a common point in said controlled switching element, said differential amplifier outputs of said differential amplifier means being connected together and defining a summin knot, each said biasing means having at least a switching-on input and a current supply output, each said current supply output of said biasing means being connected to a respective one of said second bias signal inputs of said differential amplifier means and said switching-on inputs of said biasing means receiving a control signal to operatively switch on only one of said biasing means and thereby only a respective one of said differential amplifier means, said amplifying output stage having an output stage input connected to said summing knot and an output stage output defining an attenuator output.

6. A low noise, high thermal stability attenuator of the integratable type, comprising:

a ladder-type attenuating network having an attenuating network input receiving a signal to be attenuated and a plurality of intermediate taps defining each an attenuating network output providing a different predetermined attenuation level output signal, and a controlled switching element including a plurality of differential amplifier means, a correspondent plurality of switching biasing means, and an amplifying output stage, each said differential amplifier means including an emitter-coupled transistor pair, each transistor pair comprising first and second transistors having each emitter, base and collector terminals, said emitter terminals of said first and second transistors of each said transistor pair being coupled together, said base terminal of said first transistor of each transistor pair being connected to a respective one of said plurality of attenuating network outputs, said base terminal of said second transistor of each transistor pair being connected to a common point in said controlled switching element, said collector terminals of said transistors being connected to said amplifying output stage and defining a summing knot, each said switching biasing means having a switching-on input and a current supply output, each said current supply output of said biasing means being connected to said emitter terminals of said first and second transistors of a respective transistor pair and said switching-on inputs of said biasing means receiving a control signal to operatively switch on only one of said biasing means and thereby only a respective one of said differential amplifier means, said amplifying output stage having an output stage input connected to said summing knot and an output stage output defining an attenuator output.

* * * * *